United States Patent

Ibara et al.

[11] Patent Number: 6,008,141
[45] Date of Patent: Dec. 28, 1999

[54] SEMICONDUCTOR DEVICE AND FABRICATION METHOD THEREOF

[75] Inventors: Yoshikazu Ibara; Yasunori Inoue, both of Gifu, Japan

[73] Assignee: Sanyo Electric Co., Ltd., Moriguchi, Japan

[21] Appl. No.: 09/027,715

[22] Filed: Feb. 23, 1998

[30] Foreign Application Priority Data

Feb. 25, 1997 [JP] Japan ................................ 9-041110
Feb. 5, 1998 [JP] Japan ................................ 10-024582

[51] Int. Cl.⁶ .................................................. H01L 21/00
[52] U.S. Cl. ........................ 438/754; 438/720; 438/742; 257/763; 257/770
[58] Field of Search ............................... 438/720, 721, 438/755, 742, 754; 257/763, 770

[56] References Cited

U.S. PATENT DOCUMENTS 4,878,994  11/1989  Jucha et al. ...................... 438/721 X
5,376,585  12/1994  Lin et al. ......................... 438/720 X
5,728,619  3/1998  Tsai et al. ........................ 438/721 X

OTHER PUBLICATIONS

T. Yoshida et al; J. Electrochem. Soc., vol. 137, No. 6, pp. 1914–1917, Jun. 1990.

*Primary Examiner*—William Powell
*Attorney, Agent, or Firm*—Armstrong,Westerman, Hattori, McLeland & Naughton

[57] ABSTRACT

A semiconductor device suitable for increasing operation speed and microminiaturization is provided. First and second impurity diffusion regions are formed sandwiching an element isolation insulation film. After a metal film is deposited all over a substrate, a heat treatment for silicidization is applied to form a metal silicide layer on the first and second impurity diffusion regions. The metal film not silicided is removed by etching with a predetermined region of the metal film on the two metal silicide layers and on the element isolation insulation film covered with a mask. The metal silicide layers on the first and second impurity diffusion regions are electrically connected by a metal interconnection layer that is not silicided and that extends on and in direct contact with the element isolation insulation film.

15 Claims, 12 Drawing Sheets

AMOUNT OF ADDED OXYGEN

SEMICONDUCTOR DEVICE AND FABRICATION METHOD THEREOF

BACKGROUND OF THE INVENTION

1. Field of the Invention

The present invention relates to a semiconductor device and a method of fabricating such a semiconductor device. More particularly, the present invention relates to a semiconductor device including a retail silicide layer, and a method of fabricating this semiconductor device.

2. Description of the Background Art

For the purpose of realizing increase in the integration density and speed of a semiconductor device, further reduction in the design rule has been considered these few years. At the present stage, a prototype of a 256M DRAM (Dynamic Random Access Memory) and a prototype of a CMOS (Complementary Metal Oxide Semiconductor) transistor having a gate length of 1 μm are disclosed. By such progress in the miniaturization of a transistor, reduction in the design size according to the scaling rule, and increase in the speed of operation thereof are now expected.

Although the channel resistance can be reduced by simply reducing the size of a transistor, the parasitic resistance in the impurity diffusion layer that becomes the source and drain region and resistance at the contact between conductors (contact resistance; will become equal to or greater than the channel resistance. This is a bottleneck in increasing the operation speed. Furthermore, the resistance of the gate interconnection (electrode) must be reduced in order to increase the operation speed while implementing miniaturization.

The silicide (self-aligned silicide) method is proposed (T. Yoshida et. al.: J. Electrochemi. Soc., Vol. 137. No. 6, 1990, pp. 1914–1917) as a method of reducing the parasitic resistance of the source and drain regions and the interconnection resistance of the gate electrode at the same time.

A method of fabricating a conventional p channel MOS transistor having a silicide structure and a LDD (Lightly Doped Drain) structure will be described hereinafter with reference to FIGS. 1A–1F.

Figure 1A:
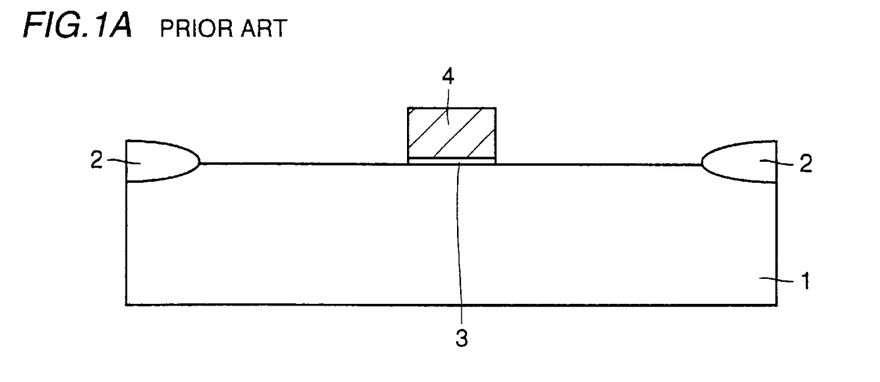
FIGS. 1A–1F show fabrication steps of a conventional semiconductor device in order.

Referring to FIG. 1A, an element isolation insulation film 2 is formed on a main surface of an n type monocrystalline silicon substrate 1 employing the LOCOS (Localized Oxidation of Silicon) method. Then, a silicon oxide film is formed on the main surface of substrate 1 by thermal oxidation. Next, a doped polysilicon film having boron doped on the silicon oxide film is formed by CVD (Chemical Vapor Deposition). The doped polysilicon film and the silicon oxide film are patterned to a desired configuration to form a gate insulation film 3 and a gate electrode 4.

Figure 1B:
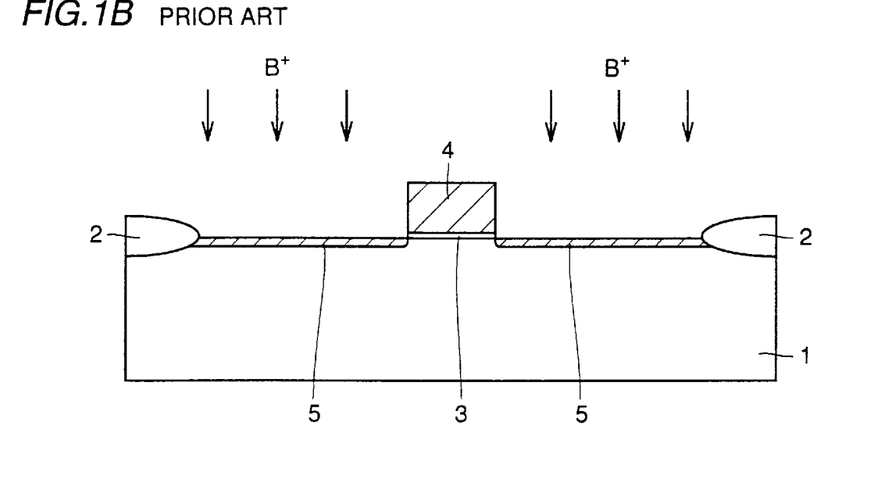

Referring to FIG. 1B, boron ions (B+) are implanted into the main surface of substrate 1 using gate electrode 4 as a mask. An impurity region 5 of low concentration is formed in self alignment.

Figure 1C:
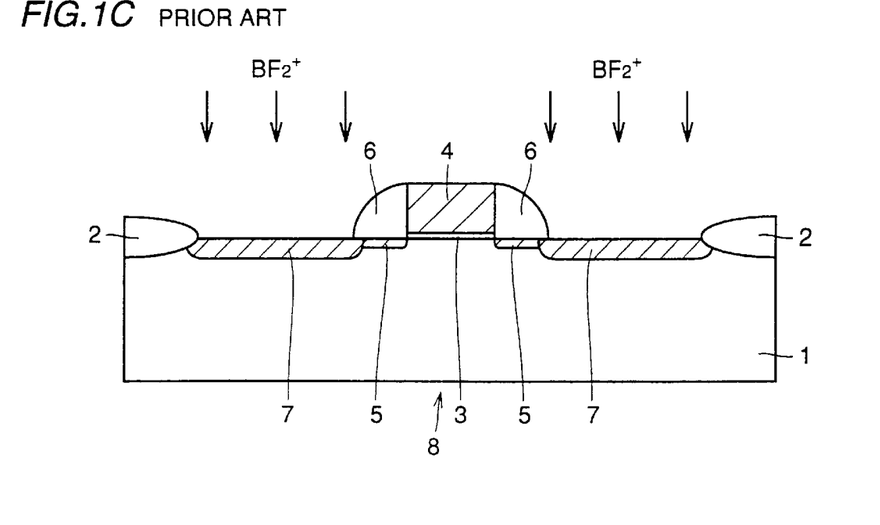

Referring to FIG. 1C, a silicon oxide film is formed all over the surface of substrate 1 shown in FIG. 1B by CVD. Then, this silicon oxide film is etched back all over to form a sidewall spacer 6 at the sidewall of gate electrode 4. Using gate electrode 4 and sidewall spacer 6 as a mask, boron fluoride ions ($BF_2^+$) are implanted into a main surface of substrate 1 to form an impurity region 7 of high concentration in self alignment.

By the above processes, a p channel MOS transistor 8 of an LDD structure is completed including the source and the drain regions formed of impurity region 5 of low concentration and impurity region 7 of high concentration, respectively.

Figure 1D:
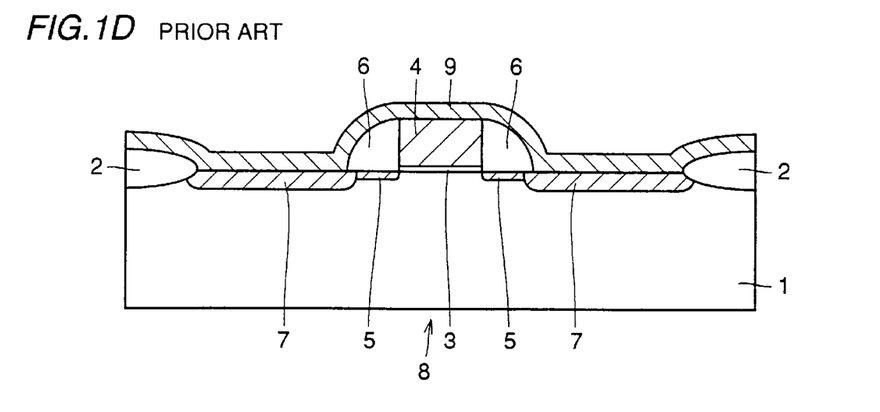

Referring to FIG. 1D, a native oxide film formed on the main surface of substrate 1 is removed by isotropic etching. Then, a titanium film 9 (for example, 30 nm in film thickness) is formed by magnetron sputtering.

Figure 1E:
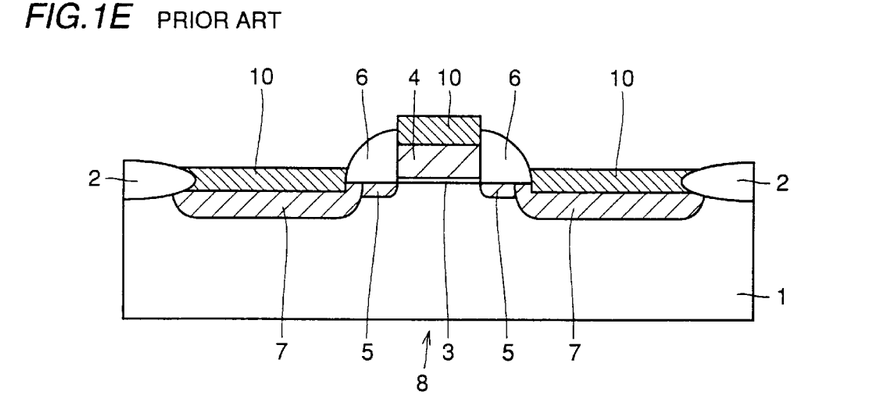

Referring to FIG. 1E, the device having the structure shown in FIG. 1D is subjected to the first heat treatment at the processing temperature of 600–700° C. by a thermal treating process in an electric furnace or RTA (Rapid Thermal Annealing). As a result, as titanium silicide ($TiSi_2$) film 10 is formed in self alignment at the region where titanium film 9 and silicon substrate 1 are in contact and the region where titanium film 9 and polysilicon gate electrode 4 are in contact. Titanium silicide film 10 formed by the first heat treatment has a C49 phase of a relatively high resistance.

The processing time is approximately 30 minutes when the thermal treating process in an electric furnace is employed and approximately 30 seconds when the RTA method is employed. Titanium silicide film 10 is not formed where titanium film 9 and element isolation insulation film 2 are in contact or where titanium film 9 and sidewall spacer 6 are in contact by this heat treatment.

Then, titanium film 9 that is not silicided is removed by wet etching using a mixed solution of hydrogen peroxide, ammonia, and water heated to approximately 60° C. (mixture ratio is $H_2O_2:NH_4OH:H_2O=1:1:5$) to leave only titanium silicide film 10.

Then, the second heat treatment is carried out at the processing temperature of 750–900° C. by a thermal treating process in an electric furnace or RTA. The processing time of the second heat treatment is identical to that of the first heat treatment. By the second heat treatment, the titanium silicide of the C49 phase is converted into a C54 phase of a relatively low resistance.

Figure 1F:
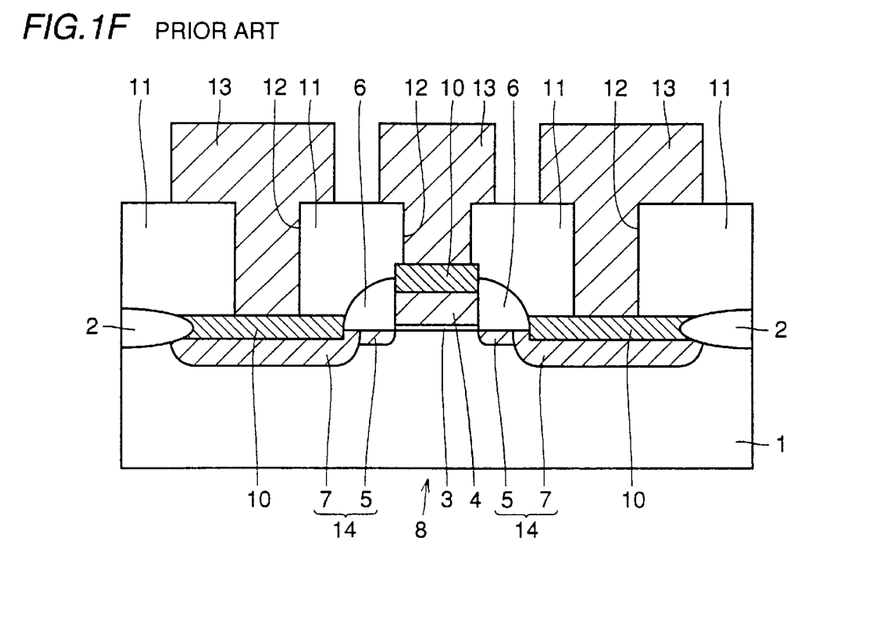

Referring to FIG. 1F, following deposition of an interlayer insulation film 11 all over the device shown in FIG. 1E, a contact hole 12 is formed in interlayer insulation film 11 by anisotropic etching to expose a portion of titanium silicide film 10. Then, contact hole 12 is filled with a metal material by sputtering to form a metal interconnection layer 13.

According to the MOS transistor 8 shown in FIG. 1F, titanium silicide film 10 is formed on the surface of source/drain region 14 and gate electrode 4. Therefore, the parasitic resistance of the source/drain region and the interconnection resistance of the gate electrode can be reduced at the same time.

FIGS. 1A–1F show fabrication of a p channel MOS transistor. When an n channel MOS transistor of an LDD structure is to be formed, an n type impurity (for example, phosphorus, arsenic or the like) are ion-implanted into the main surface of a p type substrate.

FIG. 1F shows one element formation region surrounded by element isolation insulation film 2. Three contact holes 12 are formed in the depicted region. A plurality of element formation regions isolated by element isolation insulation film 2 are present on the main surface of substrate 1. An MOS transistor located at one element formation region is electrically connected to an MOS transistor located at another element formation region via metal interconnection layer 13. Metal interconnection layer 13 extends on interlayer insulation film 11 to be connected to each MOS transistor via the contact hole. According to this interconnection structure, the number of contact holes 12 is increased. Also, the length of metal interconnection layer 13 becomes relatively greater.

A longer metal interconnection layer 13 results in a higher interconnection resistance, so that the load on the transistor is increased. As a result, the operation speed of the device will be degraded.

When a contact hole is to be formed, some margin must be provided in the area of the device taking into consideration offset in the mask alignment. This means that increase in the device area cannot be avoided if the number of contact holes to be formed is increased.

These problems are apparent by referring to FIGS. 2–5.

Figure 2:
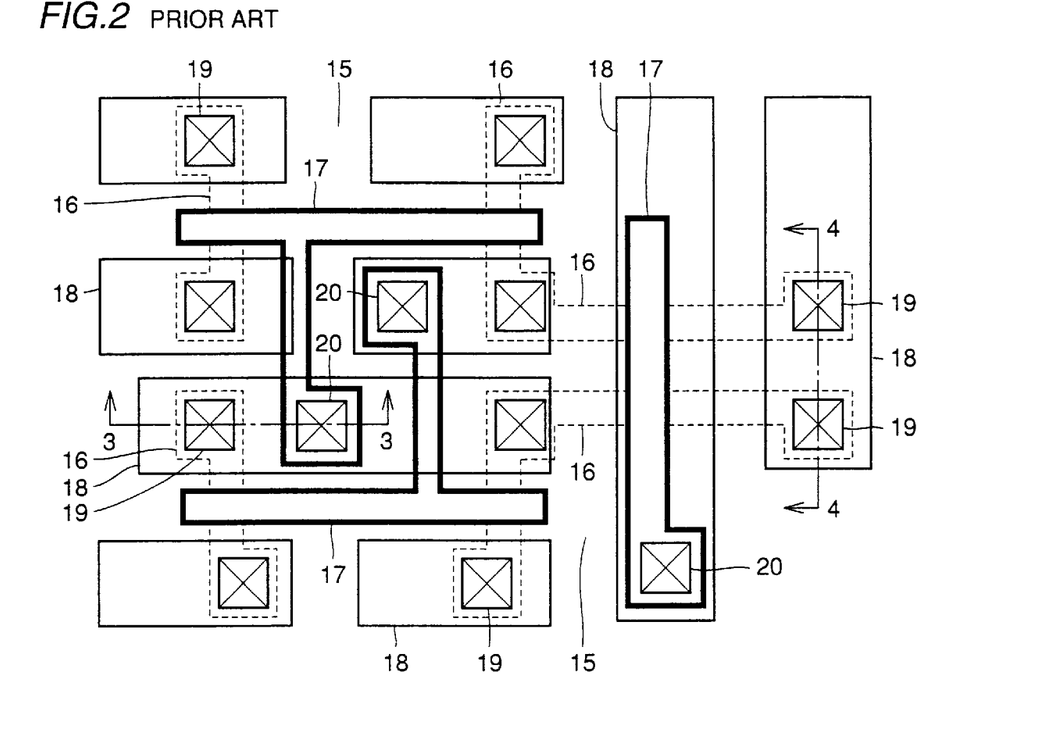
FIG. 2 is a plan view of a layout of a conventional semiconductor device.

Referring to FIG. 2 showing a plane layout, a plurality of element formation regions 16 are separated by an element isolation insulation film 15. A gate interconnection layer 17 extends so as to traverse the plurality of element formation regions 16, and is connected to the upper metal interconnection layer 18 via a contact hole portion 20. The impurity diffusion layer in element formation region 16 that becomes the source/drain region is connected to the upper metal interconnection layer 18 via respective contact holes 19. A metal silicide layer is formed above the impurity diffusion layer that is the subsequent source/drain region and above gate interconnection layer 17.

Figure 3:
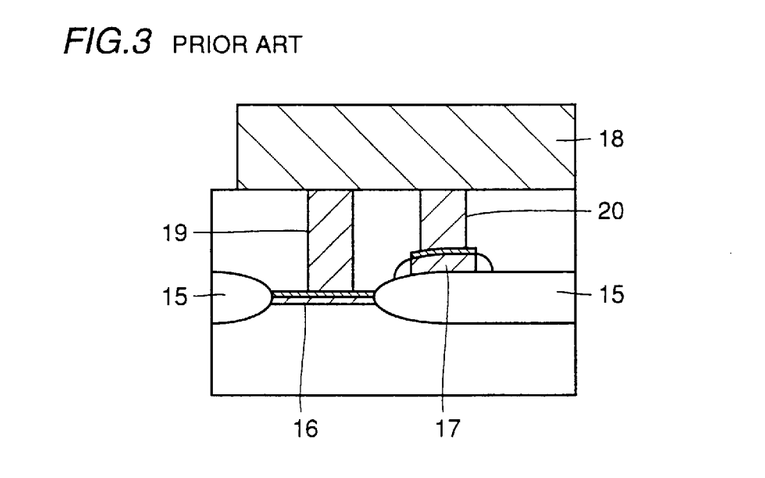
FIGS. 3 and 4 are sectional views of the conventional semiconductor device of FIG. 2 taken along line 3—3 and line 4—4, respectively.

Metal interconnection layer 18 shown in FIG. 3 electrically connects the impurity diffusion layer in element formation region 16 with gate interconnection layer 17 extending over element isolation insulation film 15 via two contact holes 19 and 20.

Figure 4:
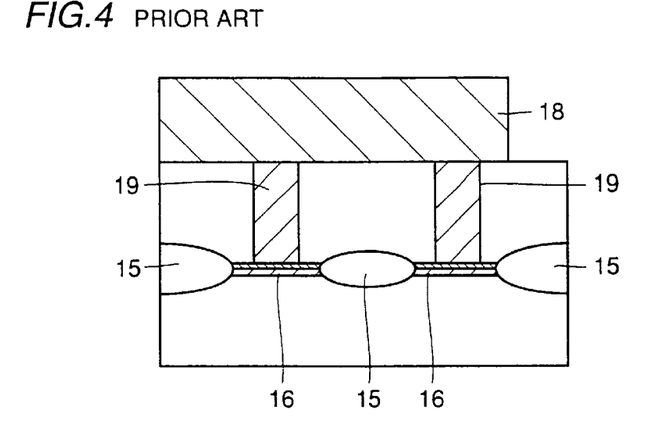

Metal interconnection layer 18 shown in FIG. 4 electrically connects the impurity diffusion layers in adjacent element formation regions 16 via two contact holes 19.

Figure 5:
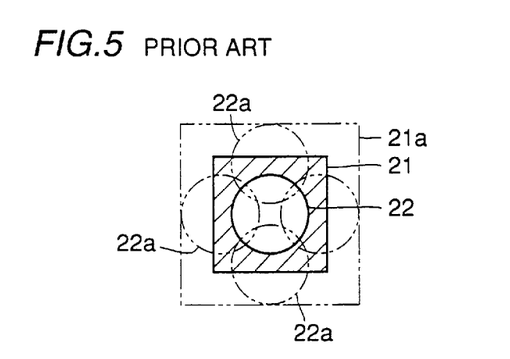
FIG. 5 is a diagram for describing position offset in forming a contact hole.

FIG. 5 shows an impurity diffusion layer 21 having an ideal size, and a contact hole 22 for forming contact with impurity diffusion layer 21. Impurity diffusion layer 21 becomes the source/drain region of a transistor. Considering the mask alignment accuracy by lithography of the current stage, slight offset in the position of contact hole 22 cannot be avoided. The position of an offset contact hole is designated by 22a. The impurity diffusion layer that is to be formed must be provided taking account of this contact hole position offset. It is therefore necessary to form an impurity diffusion layer 21a larger than a desired size. As mentioned before, increase in the device area cannot be avoided if the number of contact holes to be formed is increased.

SUMMARY OF THE INVENTION

In view of the foregoing, an object of the present invention is to provide a semiconductor device that can have operation speed improved.

Another object of the present invention is to provide a semiconductor device that can realize microminiaturization.

A further object of the present invention is to fabricate efficiently a semiconductor device that can realize increase in operation speed.

Still another object of the present invention is to fabricate efficiently a semiconductor device that can realize microminiaturization.

According to an aspect of the present invention, a semiconductor device includes an element: isolation region, first and second element formation regions isolated by the element isolation region, a first metal silicide layer formed at the first element formation region, a second metal silicide layer formed at the second element formation region, and a metal interconnection layer extending on the element isolation region and continuously connected to the first and second metal silicide layers.

According to the present aspect of the invention, the resistance of the contact portion can be reduced by the metal silicide layer. Also, since the metal interconnection layer is continuously connected to the first and second metal silicide layers and extends above the element isolation region, the interconnection length can be shortened relatively. Reduction in the resistance of the contact portion and the length of the interconnection layer contributes to improving the speed of the operation of the device.

Preferably, the first and second metal silicide layers are formed by silicidizing the metal film portion extending from the metal interconnection layer. This provides the advantage that the resistance at the contact between the metal interconnection layer and the metal silicide layer can be further reduced.

In a preferable embodiment, an element isolation insulation film is formed at the element isolation region. The metal interconnection layer extends in direct contact over the element isolation insulation film. By such a metal interconnection layer, the length thereof can be reduced significantly.

The metal silicide layer is formed on a conductive layer of the element formation region. Respective manners of the first and second metal silicide layers are set forth in the following.

i. The first and second metal silicide layers are respectively formed on an impurity diffusion layer on a main surface of a semiconductor substrate.

ii. The first and second metal silicide layers are respectively formed on a polycrystalline silicon layer.

iii. The first metal silicide layer is formed on an impurity diffusion layer on a main surface of a semiconductor substrate, and the second metal silicide layer is formed on a polycrystalline silicon layer.

iv. The first metal silicide layer is formed on the gate electrode, the source region, or the drain region of a first field effect transistor formed at a first element formation region. The second metal silicide layer is formed on the gate electrode, the source region, or the drain region of a second field effect transistor formed at a second element formation region.

In the semiconductor device according to the above aspect of the present invention, the metal interconnection layer continuously extends from the first and second metal silicide layers to above the element isolation region. It is therefore not necessary to provide a contact hole for each silicide layer. In other words, the first and second silicide layers can be electrically connected by providing one contact hole with respect to the metal interconnection layer extending above the element isolation region. Thus, the number of contact holes can be reduced.

According to the semiconductor device of this aspect, a semiconductor device that can realize increase in the operation speed and microminiaturization can be achieved.

According to another aspect of the present invention, a semiconductor device includes a semiconductor substrate having a main surface, a conductive layer and formed on the main surface of the semiconductor substrate, an insulation layer formed adjacent to the conductive layer and on the main surface of the semiconductor substrate, a metal silicide layer formed on the conductive layer, and a metal interconnection layer extending continuously from the metal silicide layer to above the insulation layer.

According to a semiconductor device of the present aspect, the interconnection resistance can be reduced by the metal silicide layer. Also, the contact hole formation region can be enlarged by taking advantage of the metal interconnection layer that continuously extends to above the insulation layer. Since it is not necessary to increase the size of the conductive layer formed on the main surface of the semiconductor substrate, microminiaturization is facilitated.

In one embodiment, a semiconductor device includes an interlayer insulation film, and an interconnection layer extending above this interlayer insulation film. The interlayer insulation film covers the metal interconnection layer and the metal silicide layer, and includes a contact hole that exposes at least one portion of the metal interconnection layer. The interconnection layer is electrically connected to the metal silicide layer via a connection conductive layer filling the contact hole. This structure provides the advantage that offset in mask alignment, if any, can be absorbed by the metal interconnection extending above the insulation layer.

The conductive layer formed on the main surface of the semiconductor substrate may be a polycrystalline silicon conductive layer, or an impurity diffusion layer formed at the main surface of a semiconductor substrate. In one example, the conductive layer includes a polycrystalline silicon conductive layer on the main surface of a semiconductor substrate with an insulation layer therebetween. The metal interconnection layer extends to above this polycrystalline silicon conductive layer. A metal silicide layer is formed where the polycrystalline silicon conductive layer and metal interconnection layer contact each other.

In another example, the conductive layer is a source or drain region of a field effect transistor formed at the element formation region. The insulation layer is an element isolation insulation film formed at the element isolation region.

A method of fabricating a semiconductor device according to a further aspect of the present invention includes the steps of forming first and second conductive layers isolated by an insulation layer and on a main surface of a semiconductor substrate; forming a metal film covering the first conductive layer, the insulation layer, and the second conductive layer; forming first and second metal silicide layers by silicidizing a portion of the metal film in contact with the first and second conductive layers; covering with a mask a predetermined region of the metal film located on the insulation film and continuously extending from the first and second metal silicide layers; and removing the metal film not silicided by etching excluding the region covered with the mask.

According to the above method of fabrication, a metal interconnection layer connecting first and second metal silicide layers can be formed simultaneous to the formation of the first and second metal silicide layers. Therefore, the number of fabrication steps can be reduced. More specifically, the formation of a contact hole for each metal silicide layer is no longer required. Only one contact hole is to be formed with respect to the metal film located on the insulation film.

In one embodiment, the metal film is a titanium film or a titanium compound film. Etching is carried out by dry etching using sulfur hexafluoride and oxygen as reaction gas.

According to still another aspect of the present invention, a method of fabricating a semiconductor device includes the steps of: forming a conductive layer and an insulation layer adjacent to each other on a main surface of a semiconductor substrate; forming a metal film covering the conductive layer and the insulation layer; forming a metal silicide layer by silicidizing a portion of the metal film in contact with the conductive layer; covering a predetermined region of the metal film located above the insulation layer and continuously extending from the metal silicide layer with a mask; removing by etching the metal film not silicided excluding the region covered with the mask; forming an interlayer insulation film covering the remaining metal film and metal silicide layer; forming a contact hole in the interlayer insulation film, exposing at least a portion of the metal film; and forming an interconnection layer on the interlayer insulation film, and electrically connected to the metal silicide layer via a connection conductive layer filled in the contact hole.

According to the above method, a metal interconnection layer extending on an insulation layer and that is electrically connected to the metal silicide layer is formed simultaneous to the formation of the metal silicide layer. Therefore, the number of fabrication steps can be reduced. Also, since the contact hole formation region can be increased taking advantage of the metal film that is left after the etching process, the conductive layer on the main surface of the semiconductor substrate does not have to be increased unnecessarily. Offset in mask alignment can be easily accommodated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A method of fabricating a p channel MOS transistor having a silicide structure will be described hereinafter with reference to FIGS. 6A–6E.

Figure 6A:
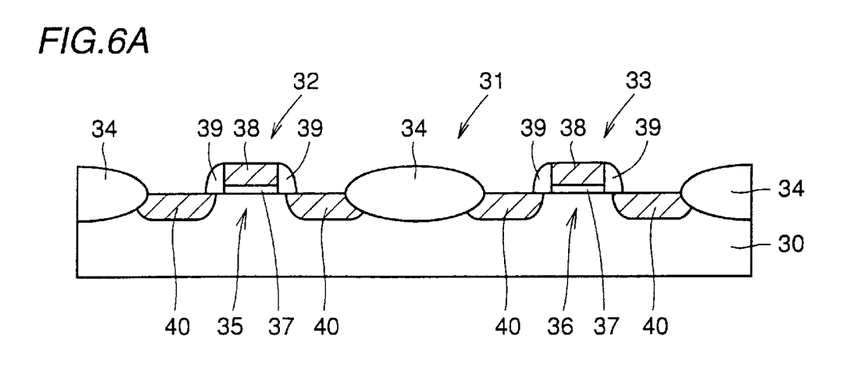
FIGS. 6A–6E show sequential fabrication steps of a semiconductor device according to the present invention.

Referring to FIG. 6A, a first element formation region 32 and a second element formation region 33 are separated by an element isolation region 31 on a main surface of an n type single crystalline silicon substrate 30. An element isolation insulation film 34 is formed at element isolation region 31 by the LOCOS method. Then, according to a process similar to that of the conventional case, a first field effect transistor 35 is formed at first element formation region 32, and a second field effect transistor 36 is formed at second element formation region 33.

Each of first and second field effect transistors 35 and 36 includes a gate insulation film 37, a gate electrode 38, a sidewall spacer 39, and a pair of impurity diffusion regions 40 that become the source/drain regions. Polycrystalline silicon having impurities doped is typically used as gate electrode 38.

Figure 6B:
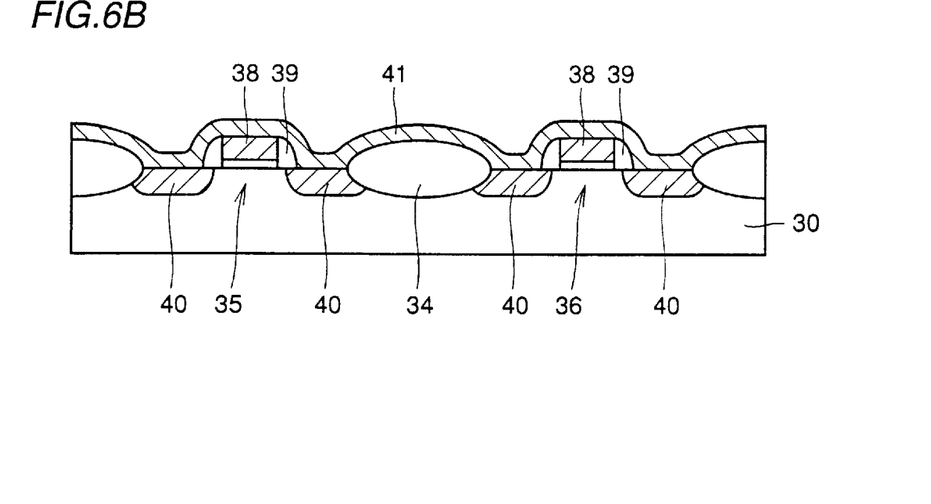

Referring to FIG. 6B, following removal of a native oxide film formed on the main surface of substrate 30 by isotropic etching, a titanium (Ti) film 41 is formed all over the surface of substrate 30 by magnetron sputtering. Titanium film 41 has a thickness of 30 nm, for example.

Figure 6C:
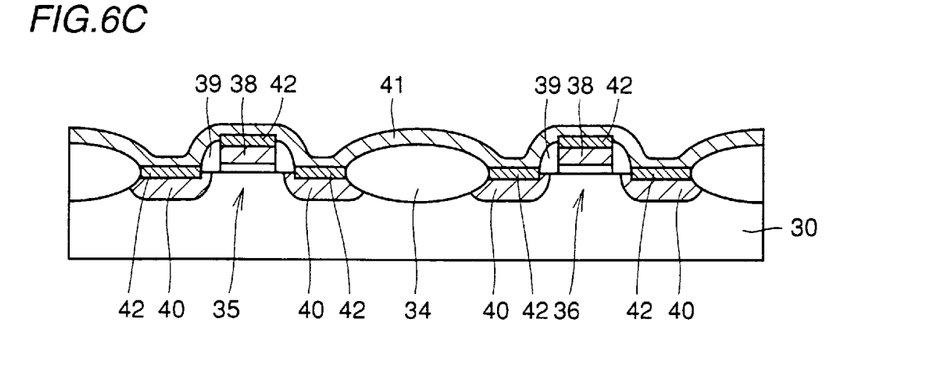

Referring to FIG. 6C, a first heat treatment is applied at a processing temperature of 100–700° C. in an electric furnace by a thermal treating process or RTA. As a result of this heat treatment, a titanium silicide (TiSi$_x$) layer 42 of C49 in phase is formed in self alignment at the region where titanium film 41 and substrate 30 are in contact and the region where titanium film 41 and gate electrode 38 are in contact. TiSi$_2$ is an example of TiSi$_x$.

The processing time is approximately 30 minutes when a thermal treating processing in an electric furnace is employed and approximately 30 seconds when RTA is employed.

This silicidizing reaction does not occur at the region where titanium film 41 is in contact with element isolation insulation film 34 and sidewall spacer 39. Therefore, titanium film 41 that is not silicided remains at the surface of these insulation films. Also, a thin film of titanium film 41 not reacted remains at the surface of titanium silicide layer 42.

Figure 6D:
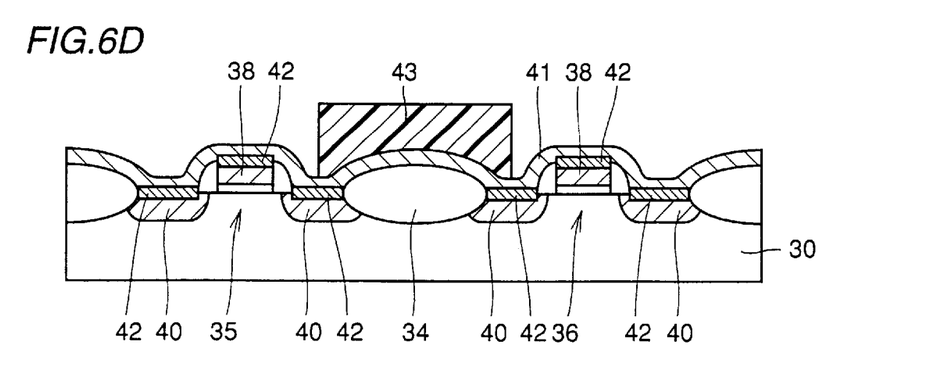

Referring to FIG. 6D, following formation of a photoresist film all over the surface of substrate 30, a patterned photoresist mask 43 is formed on a predetermined region of titanium film 41 by lithography and etching. This photoresist mask 43 is formed so as to be located between two impurity diffusion regions 40 sandwiching element isolation insulation film 34.

Figure 6E:
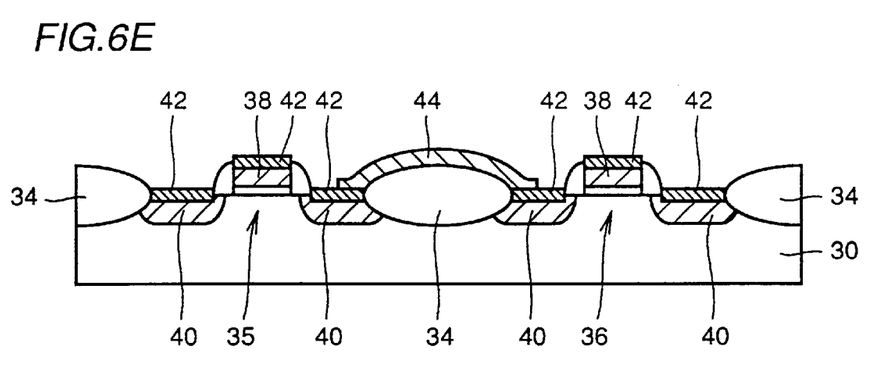

Referring to FIG. 6E, titanium film 41 is subjected to reactive ion etching with photoresist mask 43 left. Reactive ion etching is carried out according to the following conditions.

Employed gas: sulfur hexafluoride (SF$_6$)+oxygen (O$_2$)
(SF$_6$:O$_2$=10:3) Total flow rate of employed gas: 1.30 sccm
Pressure: 200 mtorr RF power: 30 W Temperature: 70° C.

The usage of the mixture gas of sulfur hexafluoride and oxygen as reaction gas facilitates etching of titanium film 41 and relatively suppresses etching of titanium silicide layer 42. As a result, in the region not covered with photoresist mask 43, titanium film 41 not silicided is removed, leaving only titanium silicide layer 42.

Since the region of titanium film 41 covered with photoresist mask 43 is not etched, this region is left as a titanium interconnection layer 44. Titanium interconnection layer 44 extends over element isolation insulation film 34, having both ends continuously connected to impurity diffusion region 40.

Figure 7:
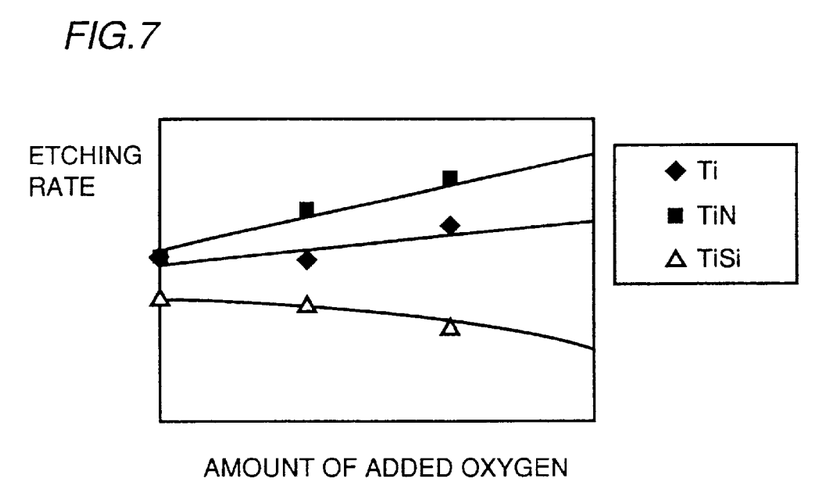
FIG. 7 shows the etching rate curve of a titanium film, titanium nitride film, and titanium silicide film over a varied oxygen flow rate.

FIG. 7 shows the measured result of the etching rate of titanium (Ti), titanium nitride (TiN) and titanium silicide (TiSi) with varying amount of added oxygen in reactive ion etching using sulfur hexafluoride and oxygen as the reaction gas. It is appreciated from FIG. 7 that the etching rate of titanium and titanium nitride can be increased than titanium silicide by using sulfur hexafluoride and oxygen as reaction gas. Thus, only the silicided portion can be selectively left by the dry etching process.

The flow rate ratio of sulfur hexafluoride to oxygen (SF$_6$/O$_2$) is preferably within the range of 2–5, particularly preferably in the range of 3–4. There is a possibility that sufficient etching will not be carried out when the flow rate ratio is lower than this preferable range. When the flow rate ratio is higher than the preferable range, there is a possibility of no selectivity being achieved since the etching rate of titanium silicide becomes equal to that of titanium nitride or titanium.

A nitrogen atmosphere is employed when the heat treatment in FIG. 6C is carried out by RTA. Therefore, although titanium film 41 that is not silicided is partially or entirely converted into titanium nitride, this titanium nitride is removed by the reactive ion etching process.

Following removal of photoresist mask 43, a second heat treatment is carried out at the processing temperature of 800–900° C. by a thermal treating process in an electric furnace or RTA. Period of time of the second heat treatment is identical to that of the first heat treatment. By the second heat treatment, titanium silicide layer 42 exhibits a transition in phase from C49 of high resistance to C54 of low resistance.

First and second field effect transistors 35 and 36 fabricated as described above have a silicide structure. The sheet resistance of gate electrode 38 having titanium silicide layer 42 at its surface and the sheet resistance of source/drain region 40 having titanium silicide layer 42 at its surface are reduced to approximately 3Ω/□ respectively.

Following the step shown in FIG. 6$_2$, the processes of formation of an interlayer insulation film, a contact hole, and a metal interconnection layer are carried out.

Figure 8:
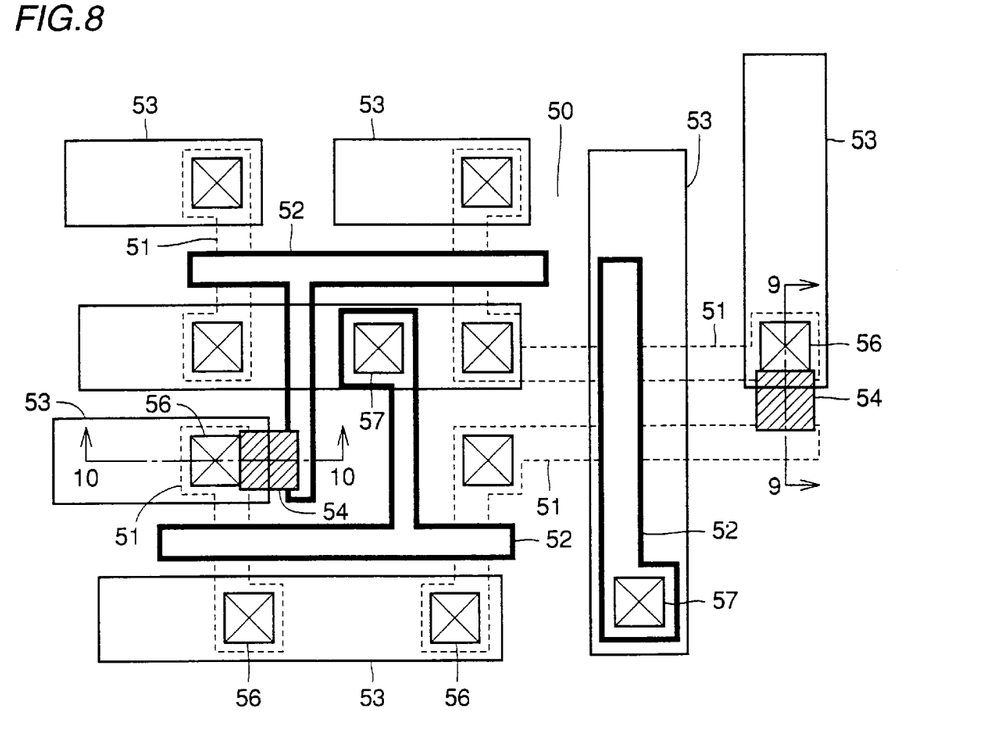
FIG. 8 is a plan layout of an embodiment of the present invention.
Figure 9:
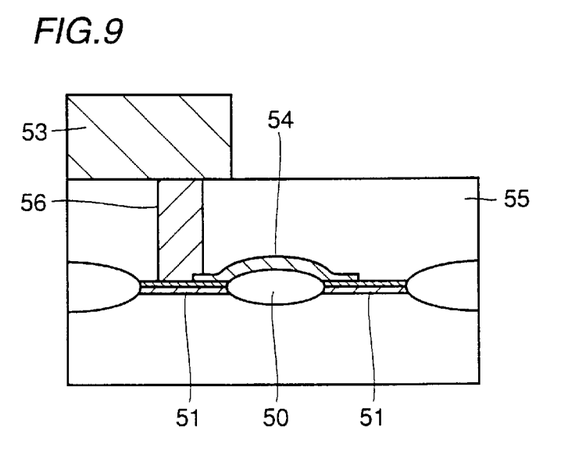
FIGS. 9 and 10 are sectional views of the embodiment of FIG. 8 taken along line 9—9 and line 10—10, respectively.
Figure 10:
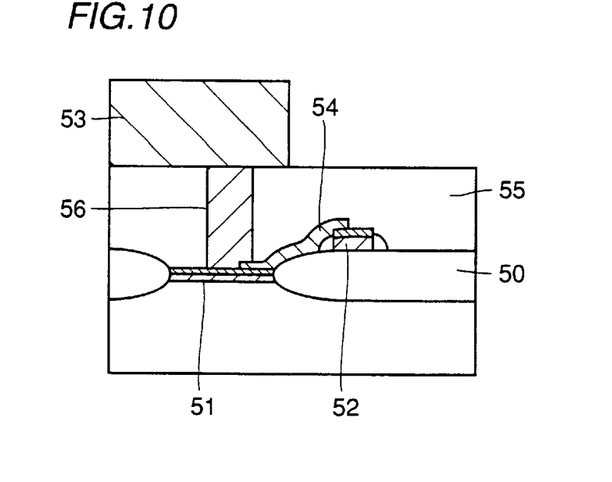

Referring to a plan layout of an embodiment of the present invention shown in FIG. 8, a plurality of element formation regions 51 are isolated by element isolation insulation film 50. A gate interconnection layer 52 extends so as to cross the plurality of element formation regions 51. As shown in FIGS. 9 and 10, an upper metal interconnection layer 53 formed on interlayer insulation film 55 is connected to an impurity diffusion region of element formation region 51 via a contact hole 56. Another upper metal interconnection layer 53 is connected to gate interconnection layer 52 via contact hole 57.

Similar to the previous embodiment, a metal silicide layer is formed on the surface of the impurity diffusion region of element formation region 51 and on the surface of gate interconnection layer 52. Referring to FIG. 9, the impurity diffusion regions of element formation regions 51 sandwiching element isolation insulation film 50 is connected by metal interconnection layer 54 that extends on and in direct contact with element isolation insulation film 50. It is apparent by comparing FIGS. 9 and 4 that the formation of metal interconnection layer 54 provides the advantage that the number of contact holes 56 can be reduced according to the embodiment shown in FIG. 9. Furthermore, the length of the interconnection layer from one element formation region 51 to another element formation region 51 can be made shorter.

According to the structure shown in FIG. 10, metal interconnection layer 54 connects the metal silicide layer on element formation region 51 with the metal silicide layer on gate interconnection layer 52 extending above element isolation insulation film 50. It is apparent by comparing FIGS. 10 and 3 that the usage of metal interconnection layer 54 directly connecting two remote metal silicide layers provides the advantage that the number of contact holes 56 can be reduced.

According to the present embodiment of the invention, the length of the interconnection layer connecting first and second element formation regions separated by an element isolation region can be made relatively shorter, and the number of contact holes can be reduced. These reductions are advantageous in microminiaturization of the device and increasing the speed of operation.

One feature of the present invention is that two metal silicide layers isolated by an insulation layer are connected by a metal interconnection layer that is not silicided and extending over the insulation layer. The two metal silicide layers to be connected may be a source/drain region or a gate interconnection layer of field effect transistors located remote from each other. Also, one metal silicide layer can be formed on the source/drain region of one field effect transistor, and the other metal silicide layer can be formed on a gate electrode of another field effect transistor.

Figure 11:
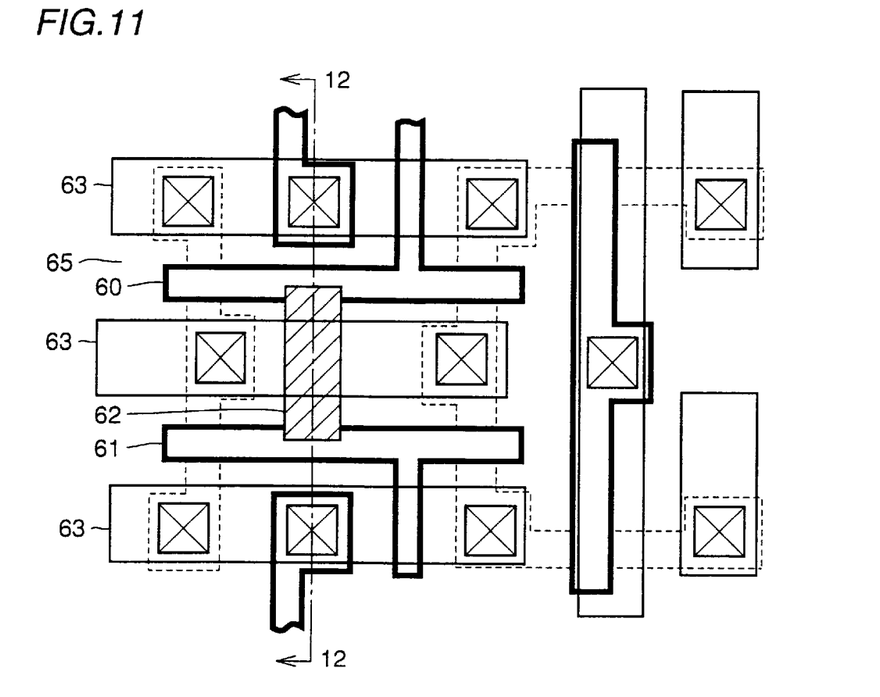
FIG. 11 shows a plan layout of another embodiment of the present invention.
Figure 12:
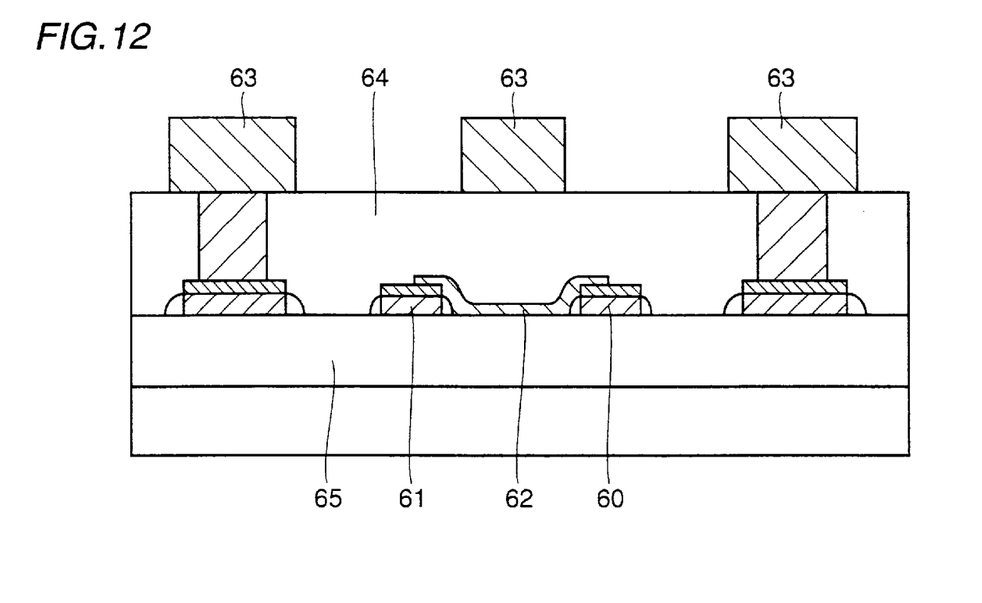
FIG. 12 is a sectional view of the embodiment of the FIG. 11 taken along line 12—12.

FIGS. 11 and 12 show an example of connecting two gate interconnection layers located remote from each other. Gate interconnection layers 60 and 61 formed remote from each other extend on an element isolation insulation film 65. A metal silicide layer is formed at the surface of gate interconnection layers 60 and 61. These two metal silicide layers are electrically connected by a metal interconnection layer 62 that is not silicided. Gate interconnection layers 60 and 61 and metal interconnection layer 62 are covered with interlayer insulation film 64, and has an upper metal interconnection layer 63 formed thereupon.

Figure 13:
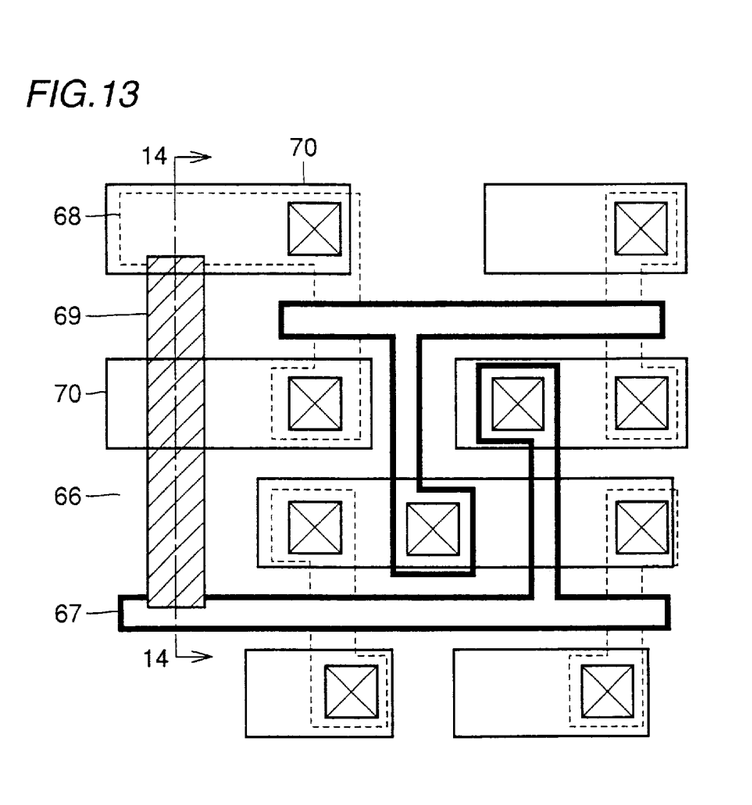
FIG. 13 shows a plan layout of a further embodiment of the present invention.
Figure 14:
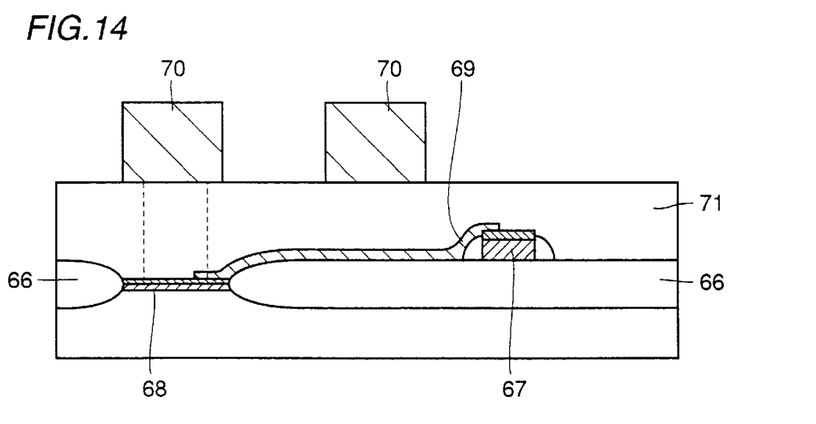
FIG. 14 is a sectional view of the embodiment of FIG. 13 taken along line 14—14.

FIG. 13 and FIG. 14 show an example of connecting an impurity diffusion region with a gate interconnection layer located extremely remote from each other. A gate interconnection layer 67 extends on element isolation insulation film 66. A metal silicide layer is formed at the surface of gate interconnection layer 67. A metal silicide layer is also formed at the surface of impurity diffusion region 68 adjacent to element isolation insulation film 66. Impurity diffusion region 68 and gate interconnection layer 67 are connected by metal interconnection layer 69 that is not silicided. Gate interconnection layer 67, impurity diffusion region 68, and metal interconnection layer 69 are covered with interlayer insulation film 71. Upper metal interconnection layer 70 is formed on interlayer insulation film 71.

Although dry etching is used to remove the titanium film not silicided in the above embodiment, wet etching can be employed instead to remove the titanium film.

Figure 15A:
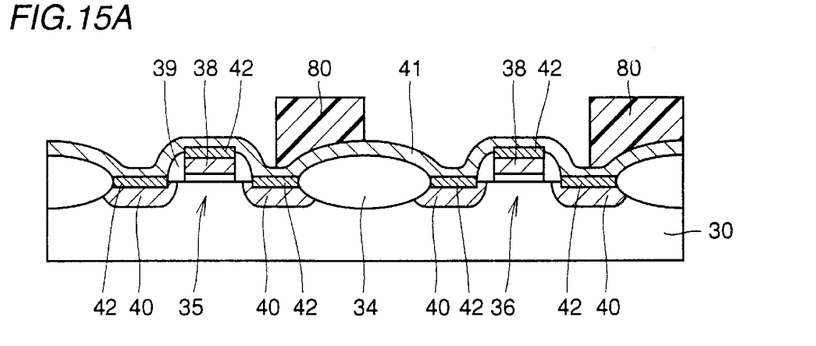
FIGS. 15A–15C show fabrication steps of a semiconductor device according to another aspect of the present invention.
Figure 15B:
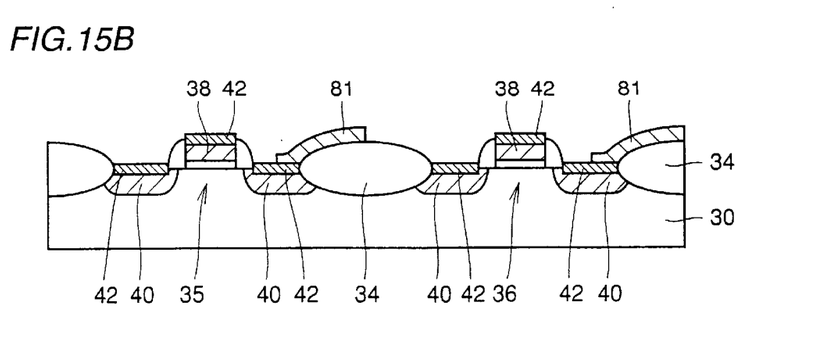
Figure 15C:
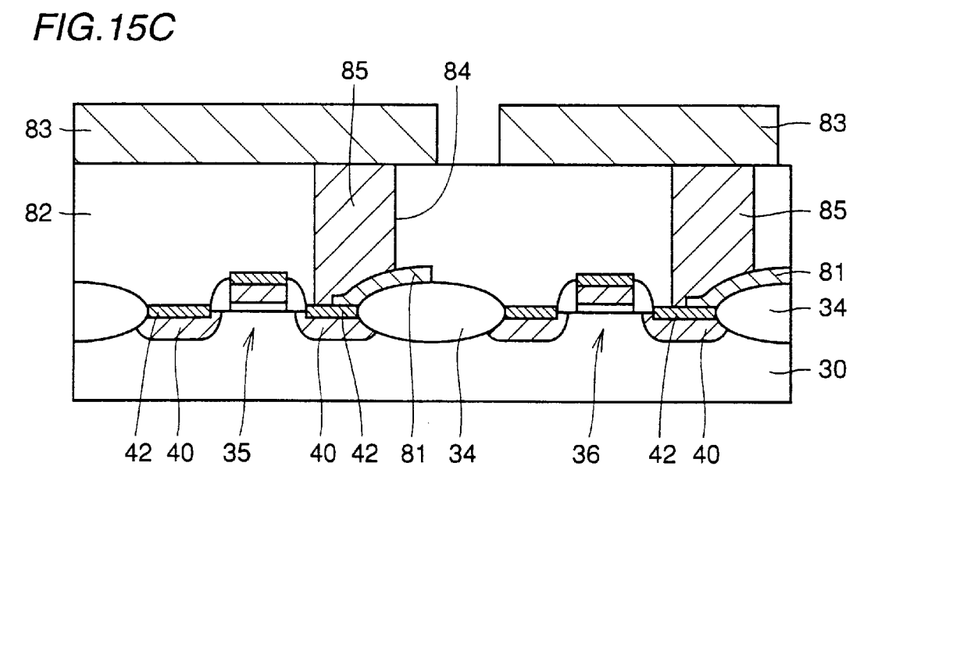

FIGS. 15A–15C show the fabrication steps according to another embodiment of the present invention. The processing steps up to FIG. 15A are identical to those of the previous embodiment described with reference to FIGS. 6A–6C. Therefore, the same reference characters are allotted for corresponding elements, and detailed description thereof will not be repeated. Issues differing from those of the previous embodiment will be described hereinafter.

Referring to FIG. 15A, a titanium silicide layer 42 is formed where titanium film 41 is in contact with gate electrode 38 and impurity diffusion region 40. Titanium film 41 has a thickness of 30 nm, for example. As heat treatment conditions for silicidization reaction, a RTA process is carried out for 30 seconds in a nitrogen atmosphere of 650° C., for example.

Then, a photoresist mask 80 patterned in a predetermined configuration is formed on a predetermined region of titanium film 41 as shown in FIG. 15A. Photoresist mask 80 extends above the region of titanium film 41 that is not silicided on titanium silicide layer 42 and element isolation insulation film 34.

Referring to FIG. 15B, reactive ion etching is carried out for 120 seconds under the conditions of a substrate temperature of 70° C. and RF power of 30 W using $SF_6/O_2$ gas. As a result, titanium film 41 not silicided is removed. In this etching process, the titanium film covered with photoresist mask 80 is not removed, and remains as titanium interconnection layer 81. Titanium interconnection layer 81 continuously extends from titanium silicide layer 42 on impurity diffusion region 68 to above element isolation insulation film 34.

Following removal of photoresist mask 80, a second heat treatment is carried out to convert $TiSi_2$ having a C49 phase of high resistance to a C54 phase of low resistance. The second heat treatments carried out by RTA in a nitrogen atmosphere of 850° C. for 30 seconds.

Referring to FIG. 15C, an interlayer insulation film 82 covering first and second field effect transistors 35 and 36 is formed. A BPSG film of 800 nm, for example, is employed as interlayer insulation film 32. Then, a contact hole 84 is formed in interlayer insulation film 82 so as to expose at least a portion of titanium interconnection layer 81. In the illustrated embodiment, contact hole 84 exposes a portion of titanium interconnection layer 81 and a portion of titanium silicide layer 42. Then, an aluminum interconnection layer 83 that is electrically connected to titanium silicide layer 42 via a connection conductive layer 85 in contact hole 84 is formed on interlayer insulation film 82.

Titanium interconnection layer 81 used in the above embodiment functions as an extension electrode of titanium silicide layer 42. The extension of titanium interconnection layer 81 to above the insulation layer allows the region for contact hole formation to be increased. Therefore, offset in mask alignment for contact hole formation can be absorbed. It is therefore not necessary to increase the impurity diffusion region to accommodate contact hole positioning offset. This is advantageous for microminiaturization.

Figure 16:
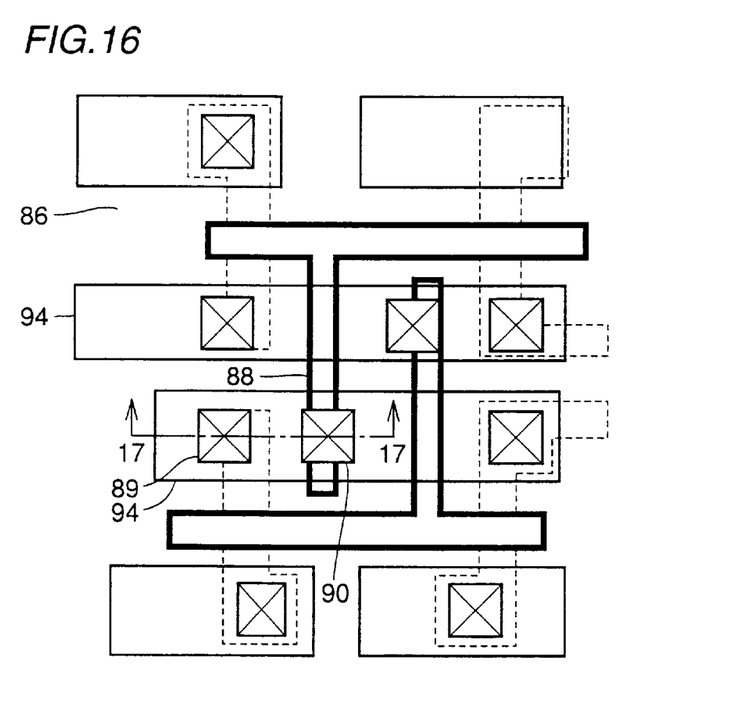
FIG. 16 shows a plan layout of still another embodiment of the present invention.
Figure 17:
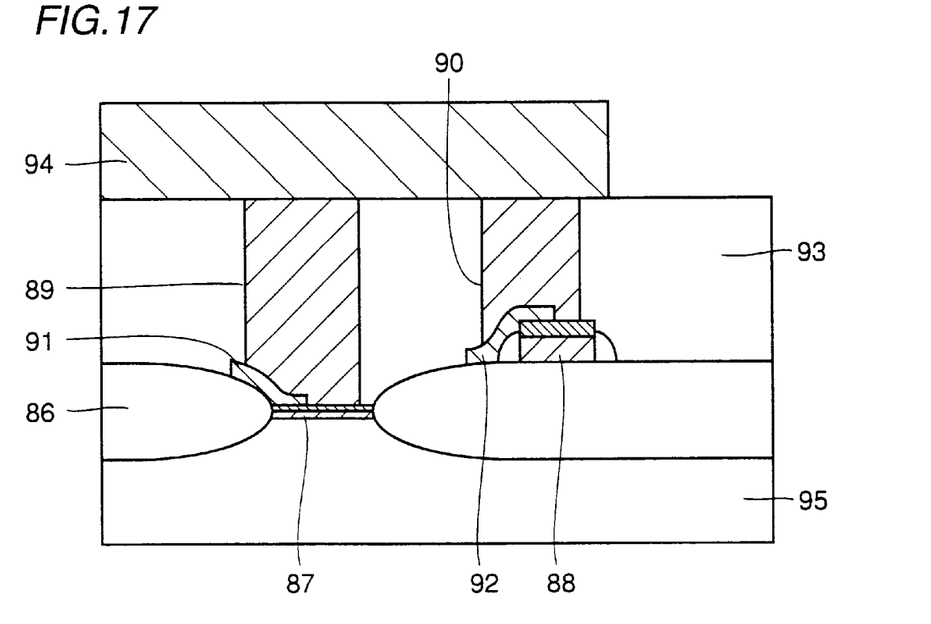
FIG. 17 is a sectional view of the embodiment of FIG. 16 taken along line 17—17.

FIGS. 16 and 17 show an example of a metal interconnection layer not silicided employed as an extension electrode for contact. An element isolation insulation film 86 and an impurity diffusion region 87 are formed at the main surface of a silicon semiconductor substrate 95. Impurity diffusion region 87 is the source/drain region, for example, of a field effect transistor, and has a metal silicide layer formed at the surface thereof. A gate interconnection layer 88 is formed on an element isolation insulation film 86. A metal silicide layer is formed at the surface of gate interconnection layer 88. Upper metal interconnection layer 94 on interlayer insulation film 93 is electrically connected to impurity diffusion region 87 via a contact hole 89. Also, upper metal interconnection layer 94 and gate interconnection layer 88 are electrically connected via a contact hole 90.

Metal interconnection layers 91 and 92 are formed at impurity diffusion region 87 and gate interconnection layer 88, respectively, to absorb positioning offset in contact hole formation. Metal interconnection layers 91 and 92 are the remainder of the metal film deposited for forming a metal silicide layer.

As shown in FIGS. 16 and 17, a metal interconnection layer that is not silicided can be used as an extension electrode for contact with both an impurity diffusion region and a gate interconnection layer.

Each embodiment described hereinbefore may be modified as follows.

(1) The field effect transistor described in each embodiment has a silicide structure. However, the present invention is not limited to a semiconductor device having such a silicide structure. The present invention is applicable to a device and a method that has a metal silicide layer formed by silicidizing a metal film.

(2) As metal to be silicided, a titanium compound such as of titanium nitride can be used instead of titanium. Also, refractory metal other than titanium can be used. For example, molybdenum, tungsten, tantalum, hafnium, zirconium, niobium, vanadium, rhenium, chromium, platinum, iridium, osmium, rhodium, cobalt, nickel and the like or a compound thereof can be used.

(3) Wet etching can be employed to remove the titanium film not silicided. In this case, a mixture solution of hydrogen peroxide and ammonia water can be used as the etching solution.

(4) An interconnection layer formed on an interlayer insulation film and a connection conductive layer filled in a contact hole may be separately formed. Alternatively, a part of the interconnection layer may be filled in the contact hole.

According to the present invention, a metal layer not silicided is positively left on an insulation layer simultaneous to forming a metal silicide layer on a conductive layer that is adjacent to the insulation layer. It is therefore possible to use the left metal layer as an interconnection layer for another element, or as an extension electrode in contact hole formation. Thus, a semiconductor device that contributes to both increase in the operation speed and microminiaturization can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an element isolation region;

first and second element formation regions separated by said element isolation region;

a first metal silicide layer formed at said first element formation region;

a second metal silicide layer formed at said second element formation region; and a metal interconnection layer extending on said element isolation region, and continuously connected to said first and second metal silicide layers.

2. The semiconductor device according to claim 1, wherein said first and second metal silicide layers are formed by silicidizing a metal film portion extending from said metal interconnection layer.

3. The semiconductor device according to claim 1, wherein an element isolation insulation film is formed at said element isolation region, and said metal interconnection layer extends above and in direct contact with said element isolation insulation film.

4. The semiconductor device according to claim 1, wherein said first and second metal silicide layers are respectively formed on an impurity diffusion region on a main surface of a semiconductor substrate.

5. The semiconductor device according to claim 1, wherein said first and second metal silicide layers are respectively formed on a polycrystalline silicon layer.

6. The semiconductor device according to claim 1, wherein said first metal silicide layer is formed on an impurity diffusion region on a main surface of a semiconductor substrate, and said second metal silicide layer is formed on a polycrystalline silicon layer.

7. The semiconductor device according to claim 1, wherein a first field effect transistor including a gate electrode, a source region, and a drain region is formed at said first element formation region, a second field effect transistor including a gate electrode, source region, and a drain region is formed at said second element formation region, said first metal silicide layer is formed on the gate electrode, the source region, or the drain region of said first field effect transistor, and said second metal silicide layer is formed on the gate electrode, the source region, or the drain region of said second field effect transistor.

8. A semiconductor device comprising:

a semiconductor substrate including a main surface;

a conductive layer formed on the main surface of said semiconductor substrate;

an insulation layer formed on the main surface of said semiconductor substrate and adjacent to said conductive layer, a metal silicide layer formed on said conductive layer, a metal interconnection layer continuously extending from said metal silicide layer to above said insulation layer;

an interlayer insulation film covering said metal interconnection layer and said metal silicide layer, and having a contact hole exposing at least a portion of said metal interconnection layer; and an interconnection layer extending on said interlayer insulation film, and electrically connected to said metal silicide layer in said contact hole.

9. The semiconductor device according to claim 8, wherein said interconnection layer comprises a connection conductive layer filled in said contact hole.

10. The semiconductor device according to claim 8, further comprising:

a polycrystalline silicon conductive layer on said insulation layer, wherein said metal interconnection layer extends to above said polycrystalline silicon conductive layer, and wherein a metal silicide layer is formed at a portion where said polycrystalline silicon conductive layer and said metal interconnection layer are in contact.

11. The semiconductor device according to claim 8, wherein said conductive layer is a source or drain region of a field effect transistor formed at an element formation region, wherein said insulation layer is an element isolation insulation film formed at an element isolation region.

12. A method of fabricating a semiconductor device comprising the steps:

forming on a main surface of a semiconductor substrate first and second conductive layers isolated by an insulation layer, forming a metal film covering said first conductive layer, said insulation layer, and said second conductive layer, forming first and second metal silicide layers by silicidizing a portion of said metal film in contact with said first and second conductive layers, covering with a mask a region of said metal film located on said insulation film and extending continuously from said first and second metal silicide layers, and removing by etching said metal film not silicided, excluding the region covered with said mask.

13. The fabrication method of a semiconductor device according to claim 12, wherein said metal film is a titanium film or a titanium compound film, and said etching is dry etching using sulfur hexafluoride and oxygen as reaction gas.

14. A method of fabricating a semiconductor device comprising the steps of:

forming a conductive layer and an insulation layer adjacent to each other on a main surface of a semiconductor substrate;

forming a metal film covering said conductive layer and said insulation layer;

forming a metal silicide layer by silicidizing a portion of said metal film in contact with said conductive layer, covering a region of said metal film located on said insulation layer and continuously extending from said metal silicide layer with a mask;

removing said metal film not silicided, excluding the region covered with said mask, by etching;

forming an interlayer insulation film covering said metal film remaining without being etched and said metal silicide layer;

forming a contact hole in said interlayer insulation film that exposes at least a portion of said metal film; and forming on said interlayer insulation film an interconnection layer electrically connected to said metal silicide layer in said contact hole.

15. The fabrication method of a semiconductor device according to claim 14, wherein said interconnection layer comprises a connection conductive layer filled in said contact hole.

* * * * *